United States Patent
Fillion et al.

(10) Patent No.: US 6,496,292 B2
(45) Date of Patent: Dec. 17, 2002

(54) METHOD AND APPARATUS FOR SHAPING A LASER-BEAM INTENSITY PROFILE BY DITHERING

(75) Inventors: Timothy Fillion, Bedford, MA (US); Arkady Savikovsky, Needham, MA (US); Jonathan S. Ehrmann, Sudbury, MA (US)

(73) Assignee: GSI Lumonics, Inc., Ontario (CA)

( * ) Notice: Subject to any disclaimer, the term of this patent is extended or adjusted under 35 U.S.C. 154(b) by 0 days.

(21) Appl. No.: 10/007,269

(22) Filed: Oct. 22, 2001

(65) Prior Publication Data

US 2002/0041418 A1 Apr. 11, 2002

Related U.S. Application Data

(62) Division of application No. 09/300,549, filed on Apr. 27, 1999, now Pat. No. 6,341,029.

(51) Int. Cl.[7] .............................................. G02B 26/08
(52) U.S. Cl. ..................... 359/201; 359/202; 359/213; 359/214; 359/305
(58) Field of Search ................................. 359/196–226, 359/298, 305; 347/256–260

(56) References Cited

U.S. PATENT DOCUMENTS

| | | |
|---|---|---|
| 3,848,104 A | 11/1974 | Locke |
| 4,532,402 A | 7/1985 | Overbeck |
| 4,775,205 A | 10/1988 | Muramatsu |
| 5,080,474 A | 1/1992 | Miyamoto |
| 5,133,602 A | 7/1992 | Batchelder et al. |
| 5,302,547 A | 4/1994 | Wojnarowski et al. |
| 5,495,279 A | 2/1996 | Sandstrom |
| 5,635,976 A | 6/1997 | Thuren et al. |
| 5,837,962 A | 11/1998 | Overbeck |

OTHER PUBLICATIONS

Montagu, Galvanometric and Resonant Low–Intertia Scanners, Gerald Marshall, Ed. Optical Scanning, 1991, pp. 549–553, Marcel Dekker Inc. New York, NY.

Proposal 5886, Rev E., PRISM Laser Exposure System, Engineering Feasibility Studies for 600mm Field and Long Lead Tasks, Apr. 24, 1996.

Final Report, PRISM Laser Exposure System, Engineering Feasibility Study for 600mm Field, Aug. 29, 1996.

"Company A" and "GSI," "The Alpha Agreement," pp. 1–28, pp. A–1—D–1, Nov. 26, 1996.

"Company B" and "GSI," "The Beta Agreement," pp. 1–32, Jun. 5, 1997.

*Primary Examiner*—James Phan
(74) *Attorney, Agent, or Firm*—Cesari and McKenna, LLP

(57) ABSTRACT

In an optical-radiation patterning apparatus, a scan mirror (29) so deflects laser light from a source (32) as to draw a pattern on a substrate (26). A focusing system (42) forms a light spot on the substrate that is significantly narrower than the line to be drawn, and it thereby minimizes the sensitivity of the line-edge position to variations in light-spot size. To achieve the intended line width, an acousto-optical device (32) introduces dither in the direction orthogonal to the light-spot motion that the scan mirror (30) causes. The focusing system (42) shapes the spot so that it is wider in the scan direction than it is in the dither direction, and this permits a relatively high scan rate for a given dither frequency.

31 Claims, 11 Drawing Sheets

METHOD AND APPARATUS FOR SHAPING A LASER-BEAM INTENSITY PROFILE BY DITHERING

CROSS-REFERENCE TO RELATED APPLICATIONS

The present application is a divisional of commonly assigned copending U.S. patent application Ser. No. 09/300,549, which was filed on Apr. 27, 1999, U.S. Pat. No. 6,341,029, by Timothy Fillion et al. for a Method and Apparatus for Shaping a Laser-Beam Intensity Profile by Dithering and is hereby incorporated by reference.

BACKGROUND OF THE INVENTION

1. Field of the Invention

The present invention is directed to optical-radiation patterning devices and in particular to dithering the positions of the light spots with which they write.

2. Background Information

Photolithography for small integrated-circuit chips is ordinarily performed by employing a fixed-position light source whose output shines through a mask onto a substrate. The substrate thereby receives a light pattern that selectively causes reactions in light-sensitive chemicals that coat the substrate's surface. Subsequent process steps rely on the resultant chemical patterns to etch the substrate selectively and produce the desired features.

But mask use does not scale well to large patterns, such as those needed for certain types of advanced computer monitors and television screens. For these applications, so-called direct-write patterning apparatus has been proposed. The pattern produced by such apparatus results from moving a light spot about the substrate surface. Typically, laser light is deflected by scanning mirrors to cause the desired light-spot motion.

One of the direct-write approach's difficulties is that it tends to be sensitive to laser-beam variations that cannot always be prevented. FIG. 1 illustrates the resultant problem. Plot 12 represents the typical Gaussian laser-beam intensity profile, while line 14 represents a threshold intensity below which the required degree of chemical reaction or other effect does not occur. A beam having that intensity profile and scanned in the direction represented by arrow 16 results in a line whose width is $w_1$. If $w_1$ is the desired line width, the intended result is achieved so long as the laser beam's intensity profile remains that of plot 12. But that profile can change if, say, some loss of focus occurs or there is an unintended change in the laser's power. For example, suppose that an un-intended drop in laser power changes the intensity profile to that of plot 18 The resultant line width will then be $w_2$, which is not intended.

Designers of direct-write systems have reduced this sensitivity of feature size to beam intensity by taking advantage of the fact that, for a given beam-intensity the change, the absolute size of an edge-position variation is proportional to the spot size. In FIG. 2, for instance, the edge-position difference d resulting from a given intensity variation when the spot size is small is less than the edge-position difference d' (FIG. 1) that results when the spot size is larger.

Without more, of course, this smaller spot size also results in lines that are narrower than desired. To obtain the desired line width but keep the lower sensitivity to intensity variation, workers in this field have "dithered" the spot position with respect to the major, scanning motion. That is, they have superimposed on the scan motion a small cyclical motion orthogonal to the scan motion so as to "paint" a wider line. The small cyclical motion must be fast enough in comparison with the scanning motion that half cycles of the dither motion overlap each other and result in an effective light-spot width that is greater than the width of a stationary spot. If dither motion orthogonal to the scanning direction is so superimposed on the scanning motion as to result in a track like that of FIG. 3, for instance, the resultant effective intensity profile is that shown in FIG. 4. As that drawing shows, the line width is the same as in FIG. 1, but its edge-position variation d" is much less.

Although dithering contributes significantly to repeatability, it does exact a certain speed penalty: the scanning speed must be low enough to permit the dither-deflection system actually to perform dithering, i.e., to permit half cycles actually to overlap and thereby result in a continuous feature line.

SUMMARY OF THE INVENTION

We have found two ways of reducing the speed penalty that dithering imposes.

The first way is to employ an acousto-optical device to perform the dither deflection. Whereas the operation of devices previously employed for dither deflection involved gross movement of the deflecting element, the degree of deflection introduced by acousto-optical devices is set by the frequency of the acoustic waves with which they are driven. Since acousto-optical devices thereby avoid the gross motion required of conventional dither-deflection devices, they are capable of much faster deflection, so they can permit the associated scanning motion to be much faster. As will be explained below, moreover, the resultant absence of any gross inertial effects permits the system to exercise greater control over the dither-deflection pattern and thus over the effective intensity profile.

A second way that we have devised for reducing dither-imposed speed penalties is to employ an anamorphic light spot, i.e., a light spot that is wider in a major-axis dimension than in a minor-axis dimension. The advantage afforded by the use of an anamorphic light spot results from the fact that writing speed is also limited by the average power that the light source delivers to the substrate. The smaller spot size used in dithering conventionally tends to reduce the total power that the light source can deliver to the substrate. This is because there typically are process limitations on the amount of power per unit area the substrate can safely absorb. So the light beam's total power in conventional approaches must be reduced as the light spot's size is.

Using an anamorphic spot avoids this problem. Specifically, as the spot width in the dither direction decreases to reduce edge-position variation, the spot width in the direction orthogonal to the dither direction can be increased so as to maintain the desired total power without exceeding process limits on power per unit substrate area.

BRIEF DESCRIPTION OF THE DRAWINGS

The invention description below refers to the accompanying drawings, of which.

DETAILED DESCRIPTION OF AN ILLUSTRATIVE EMBODIMENT

Figure 5:
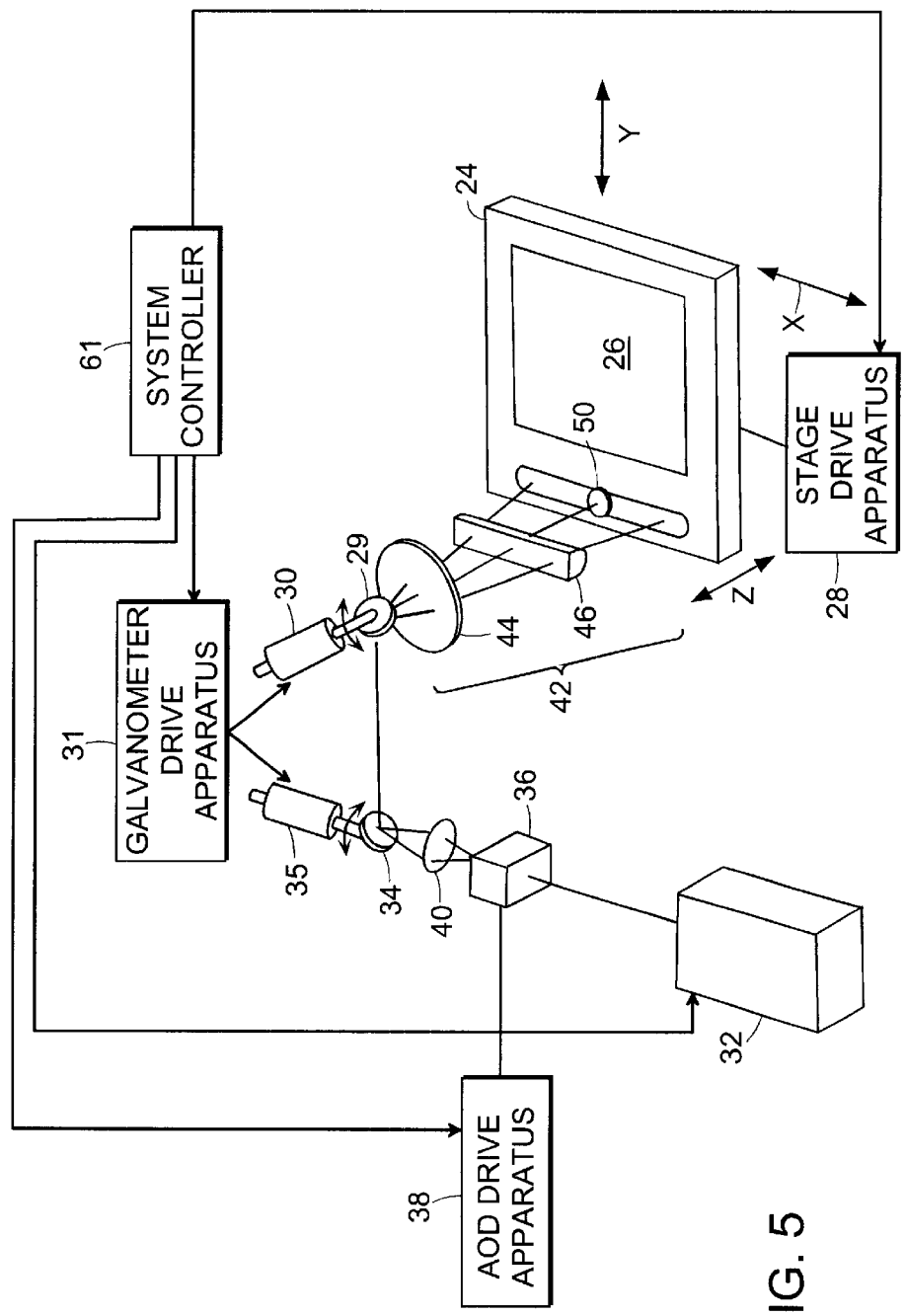
FIG. 5 is a conceptual diagram of a patterning apparatus that employs the present invention's teachings.

FIG. 5 illustrates an optical-radiation patterning apparatus 20 that employs the present invention's teachings. It includes a stage 24 that holds a substrate 26 to be patterned, and it is driven along y-axis directions by an appropriate drive apparatus 28. As the substrate 26 is thus being moved in the y direction, a scan-deflection mirror 29 driven by a galvanometer 30 under the control of galvanometer drive apparatus 31 controls the x-axis position at which light from a laser source 32 strikes the substrate 24. In general, that is, the stage-drive apparatus 28 controls the y-direction position at which the light beam strikes the substrate 26, while scan-deflection mirror 30 controls its x-direction position. But there is usually some y-direction correction that needs to be made. For example, it is often convenient for x-direction feature lines to be written as though the substrate were stationary, i.e., as though no y-direction motion were occurring. So a y-axis-deflection mirror 33 driven by a galvanometer 34, also under the control of drive apparatus 31, may optionally be included to provide that compensation as appropriate.

Regardless of whether the system provides such y-direction compensation, it also provides y-direction deflection (or deflection with at least some component orthogonal to the major scan direction) for dithering. In accordance with the present invention, an acousto-optical device 36 provides that dither deflection. Acousto-optical devices, which are sometimes called "acousto-optical modulators" or "acousto-optical deflectors," are commercially available systems commonly used to deflect light beams for other purposes. Each includes a crystal and an acoustic actuator. The crystal in acousto-optical device 36 is interposed in the light-beam path. It deflects the beam at a Bragg angle defined by periodic strains in the crystal that acoustic excitation from the acoustic actuator produces under the control of an acousto-optical-device drive apparatus 38. The frequency of the acoustic signal that excites the crystal determines the degree to which the acousto-optical device 36 deflects the beam. So the light-spot position can be made to oscillate by cyclically varying the excitation frequency of the acousto-optical device 36.

Acousto-optical devices that can be used for this purpose are readily available. Although the particular type is not critical, we have employed a commercially available model that uses a 55 MHz carrier frequency and yields greater than 85% optical efficiency over a ±15 MHz range when it is used to deflect 1064-nm laser light.

To keep the y-axis-deflection mirror 34 relatively small despite the dither deflections, the illustrated embodiment includes a relay lens 40 is disposed downstream of the acousto-optical device and images the acousto-optical device on mirror 34 a point in the beam path anterior to the acousto-optical device's deflection of it. As a result, the dither deflections cause in the beam only to pivot about mirror 34's surface, not to move across it.

To form the desired spot on the substrate, the optical system includes a focusing lens system 42. Those-skilled in the art will recognize that a lens systems provided for high-accuracy large-format patterning are typically somewhat complex, often having field-flattening properties, for instance. But none of those aspects is particularly germane to the present invention. The only feature of interest here is the system's anamorphic nature, which the drawing suggests by representing the focusing lens system 42 as a largely spherical element 44 and a largely cylindrical element 46.

Figure 6:
FIG. 6 is a diagram showing the outline of a laser-produced light spot that can be employed in accordance with some aspects of the present invention.

As will be explained below, the resultant spot shape is oblong. The benefits of acousto-optical dithering can be obtained even with a symmetrical spot, though, so we begin our description of the dither effect by assuming that the spot has the circular shape that FIG. 6 illustrates. The beam intensity everywhere within FIG. 6's outline 48 is at least, say, $1/e^2$ of its maximum value, while the intensity outside that outline is below that fraction. If the deflection is then dithered in the y direction, the effective spot shape will be that of FIG. 7.

Figure 4:
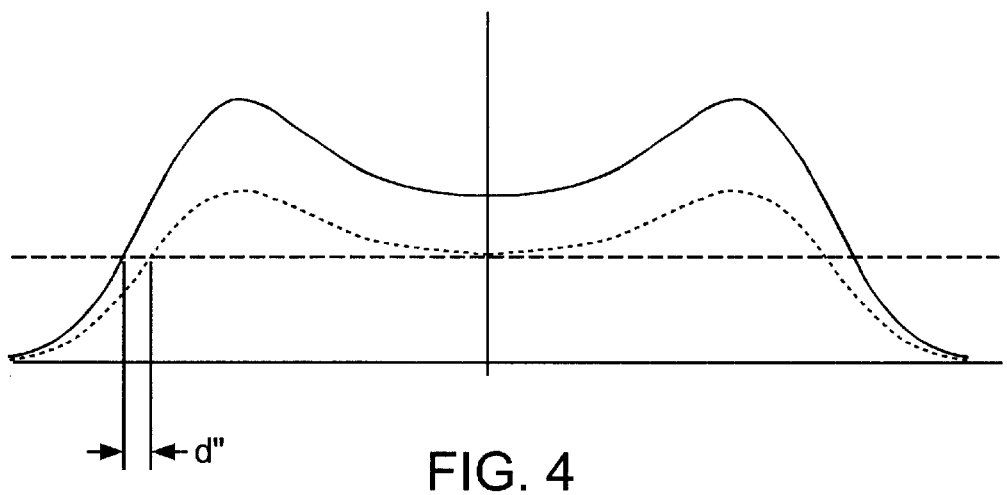
FIG. 4, described above, is the resultant effective intensity profile.
Figure 7:
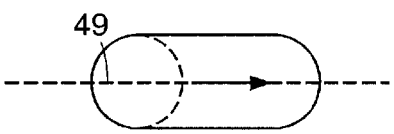
FIG. 7 is a diagram of the effective spot shape that results when the light spot of FIG. 6 is dithered.

The particular intensity profile within FIG. 7's light spot depends on the dither-control waveform. If the frequency of the acoustic disturbance by which the crystal is excited so varies that the deflection is sinusoidal as a function of time, the intensity profile taken along FIG. 7's dashed line 49 will be similar to that described above in connection with FIG. 4: the intensity profile is similar to the type of profile that conventional dithering approaches produce.

Although that profile has proved to be acceptable in a number of applications, there are other applications in which effective patterning actually requires that the profile be flatter. Conventionally, workers in this art have had to resort to masking out the profile's lateral peaks in order to obtain the desired flatness. Before the present invention, it was not often practical to obtain a flatter profile by using a non-sinusoidal deflection pattern, because deflection-apparatus inertia effectively required sinusoidal deflection patterns if conventional deflection devices were to achieve their maximum speeds.

Figure 8:
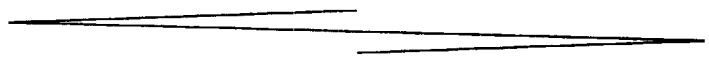
FIG. 8 depicts a path taken by a scanning light spot subjected to triangular-wave dither.
Figure 9:
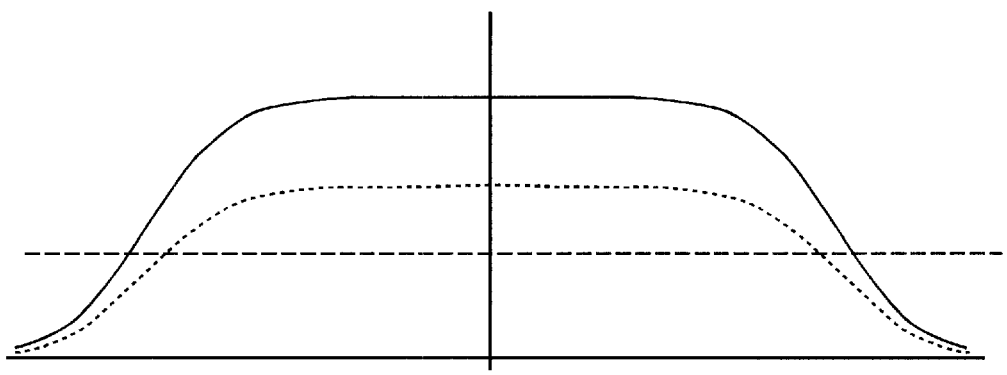
FIG. 9 is a plot of the resultant effective intensity profile.

Because inertia is not an issue in acousto-optical devices, on the other hand, the deflection patterns can be chosen with much more freedom. For instance, the dither-deflection waveform can be triangular rather than sinusoidal: it can result in the FIG. 8 path when it is superimposed on the scanning deflection. The result is the relatively flat profile that FIG. 9 illustrates.

Figure 10:
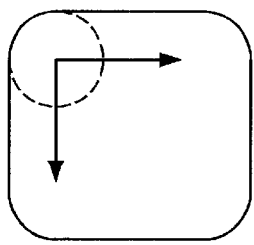
FIG. 10 is a diagram depicting the effective spot shape results from a single beam deflected by two orthogonally deflecting acousto-optical devices whose deflections vary at different frequencies.
Figure 11:
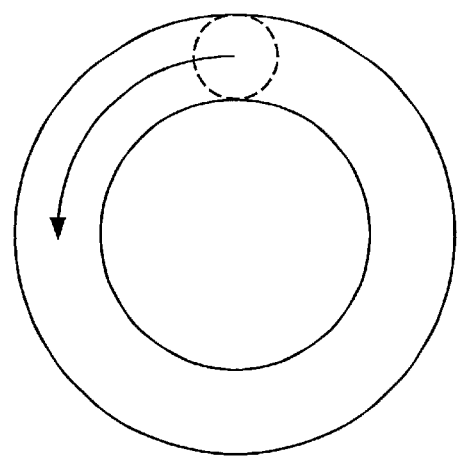
FIG. 11 is a similar diagram of the effective spot shape that results from a single beam deflected by two orthogonally deflecting acousto-optical devices whose deflections vary at the same frequency but 90° out of phase with each other.

Dither deflection need not be restricted to displacement in one dimension. For example, FIG. 10 illustrates the effective spot shape that can result when a single beam is deflected by two orthogonally deflecting acousto-optical devices whose excitation frequencies vary at different rates. Also, although half cycles of the dither-deflection oscillation need to overlap in order to completely "paint" the feature being drawn by the major, scanning deflection, the overlapping half cycles do not need to succeed each other immediately. For instance, consider the effective spot shape of FIG. 11, which results when the deflections produced by two orthogonally deflecting acousto-optical devices vary sinusoidally at the same frequency but 90° out of phase with each other. Clearly, the forward half cycle does not overlap the rear half cycle. So long as at least two cycles of the dithering deflection occur for each spot-width increment of scanning deflection, though, the desired line width will be achieved without gaps. (Since the beam intensity has a Gaussian profile, a good definition of spot width for this purpose is the width, as measured in the scan direction, of the region in which the intensity is greater than $1/e^2$ of the maximum value.)

Figure 12:
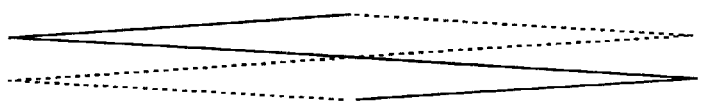
FIG. 12 is a plot of the paths of two light spots simultaneously dithered at the same frequency but 180° out of phase.

Indeed, the overlying half cycles do not even have to be provided by the same beam. If gap avoidance requires that scan deflection be slow enough to result in the path of FIG. 8 when a single beam is used for patterning, the scan speed can be doubled if two direct-write beams are employed simultaneously and dithered 180° out of phase. FIG. 12 depicts the two resultant beam paths. A patterning arrangement of the general type depicted in FIG. 5 that employs two light spots simultaneously would include two laser sources with respective oppositely driven acousto-optical devices, relay lenses, and y-axis deflection mirrors but use a common scanning mirror and focusing elements.

Figure 13:
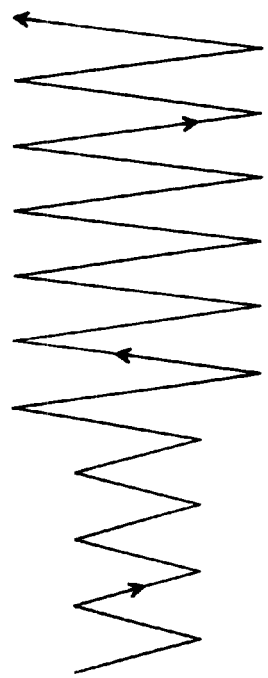
FIG. 13 is a diagram depicting the track of a single light spot whose dither amplitude changes dynamically.
Figure 14:
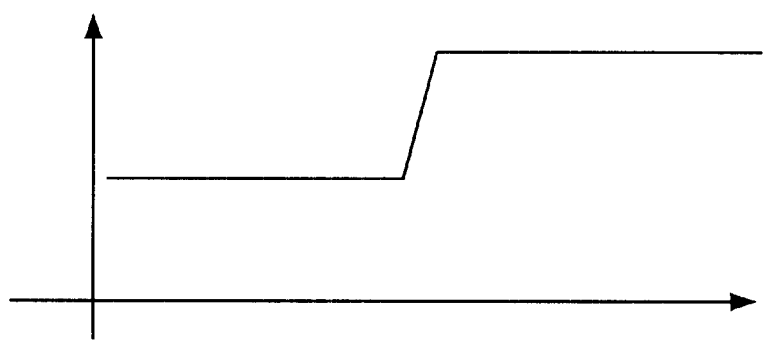
FIG. 14 is a plot of the beam-intensity variation that should accompany the dither-amplitude variation depicted in FIG. 13.

As FIG. 13 illustrates, the dither-deflection amplitude can be increased dynamically to vary pattern-line width. When this occurs, the beam-intensity drive signal should be varied, as FIG. 14 illustrates, to compensate for what would otherwise be a reduction in average delivered energy per unit area.

Figure 15:
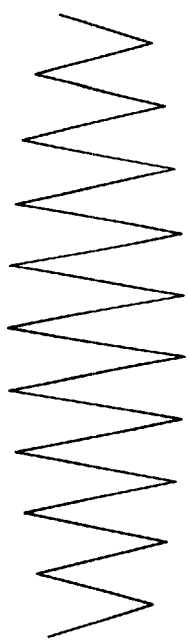
FIG. 15 is a plot of dither-direction beam deflection as a function of scan-direction beam deflection illustrating dither-amplitude variation use to compensate for lens distortion.
Figure 16:
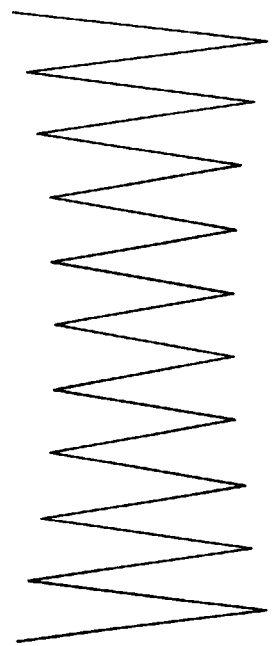
FIG. 16 is a diagram of the path that a spot would take in the absence of FIG. 15's compensation.
Figure 17:
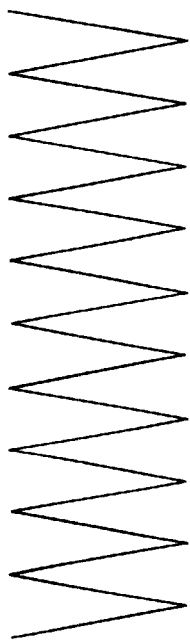
FIG. 17 depicts the light-spot path that results from the compensation illustrated in FIG. 15.

Note that beam-intensity change compensates for dither-amplitude variation in the spot path, not necessarily in the beam deflection. For example, the dither-direction beam deflection that FIG. 15 depicts as a function of scan-direction beam deflection can be used to compensate for path distortion, depicted in FIG. 16, that the lens would otherwise introduce. That compensation results in the uniform-width spot path of FIG. 17, so a uniform beam-intensity drive would be in order.

Figure 18:
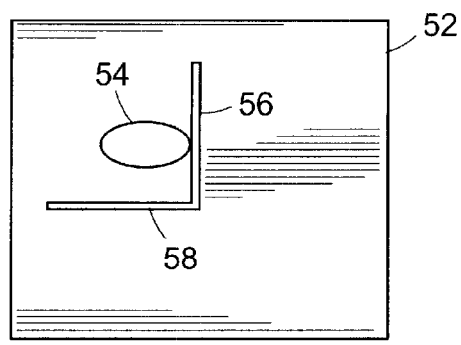
FIG. 18 is a diagram of a calibration mask employed in the apparatus of FIG. 5.

To determine the relationship between various control-signal values and the resultant effective intensity profiles, we provide FIG. 5's stage 24 with a beam-profile detector 50. That detector includes FIG. 18's mask 52. The dithered beam 54 is directed to the mask and stepped across one or the other of two orthogonal slits 56 and 58. A convenient slit width is, say, one-tenth the intended spot width, and each step is typically one-half a slit width.

Figure 19:
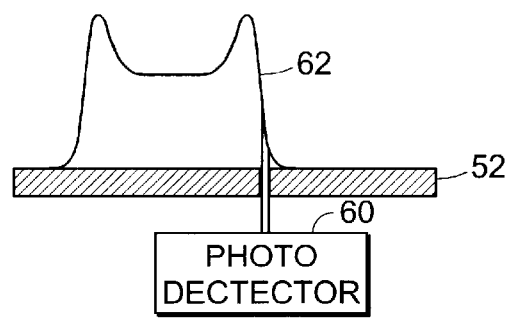
FIG. 19 is a diagram illustrating an intensity measurement made by using the mask of FIG. 18.
Figure 20:
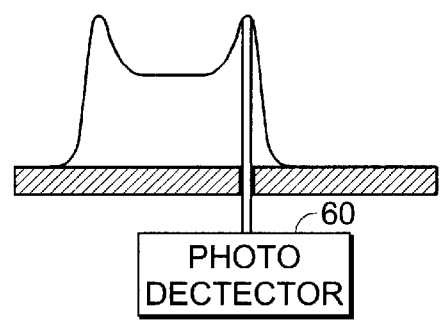
FIG. 20 is a diagram similar to that of FIG. 19 that illustrates measurement of a different part of the effective-intensity profile.
Figure 21:
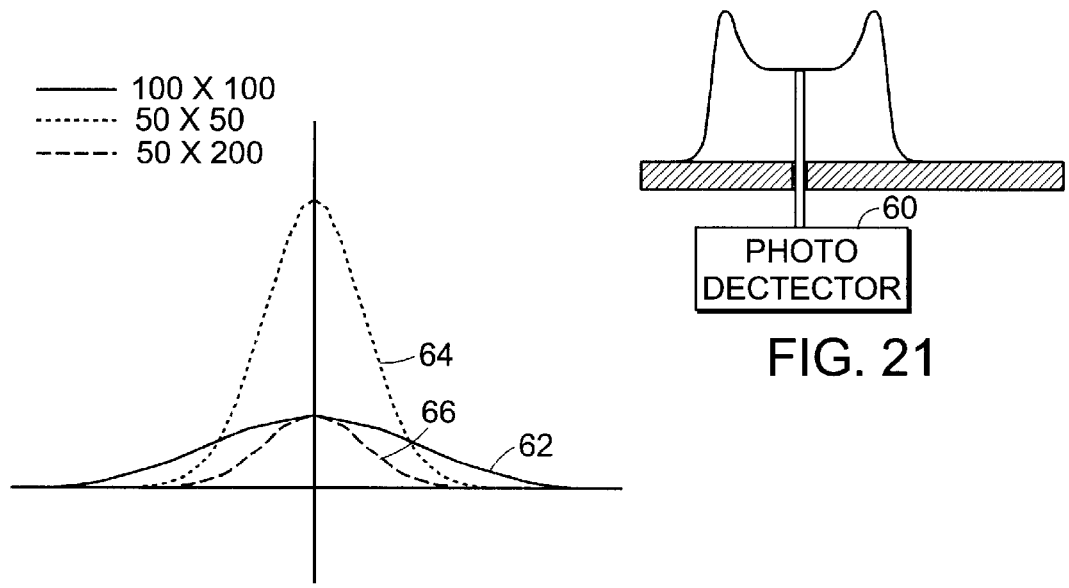
FIG. 21 is a diagram similar to FIGS. 19 and 20 that illustrates measurement of yet another point in the effective-intensity profile.

FIG. 19 shows the effective intensity profile of a dithered spot positioned to take a measurement of the profile's skirt area, while FIGS. 20 and 21 depict measurements of peak and central portions, respectively. At each step, a photodetector 60 measures the average intensity of the light that passes through the slit. By recording the intensity measured at each step, the system can form a two-dimensional profile of the beam's intensity. The lens distortion mentioned in connection with FIG. 16 also affects the intensity profile. So profiles should be taken for different scan positions, and it is therefore convenient for the stage-drive apparatus to be capable of translating the stage (and thus the profile detector) in the x direction as well as they direction. FIG. 5's system controller 61, which contains the pattern to be imparted, uses a look-up table constructed from the data thus collected to translate scan positions and desired spot widths to the control-signal values needed to achieve the spot size that the pattern requires.

Figure 22:
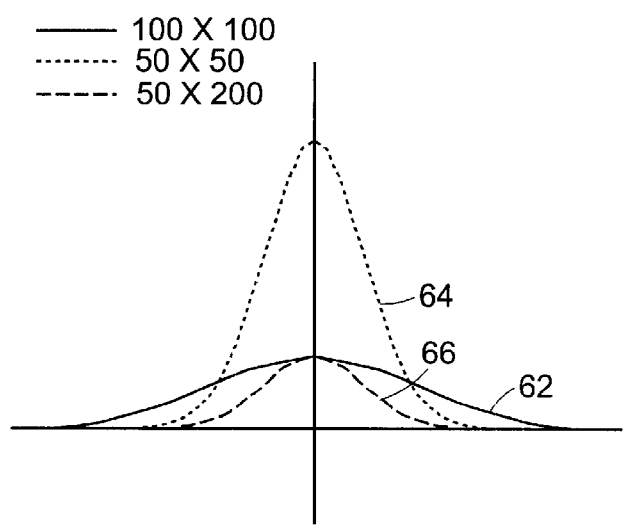
FIG. 22 is a graph of the intensity profiles that result from different spot shapes.

We now turn to another aspect of the invention. Although this aspect is preferably employed with an acousto-optical deflection apparatus of the type just described, it can also be used with other dither deflectors. Its purpose can be appreciated best by considering the spot profiles that FIG. 22 depicts. Let us assume that the desired line width is 100 microns. FIG. 22's plot 62 represents the intensity profile of a conventional, symmetrical Gaussian beam employed to achieve this line width without dithering: its spot width is 100 microns both in the direction parallel to the scan motion and in the direction perpendicular to it.

Now consider forming a beam that is half as wide, i.e., 50 microns, so that its sides are steeper and can therefore achieve the desired edge-position insensitivity by dithering. If one attempts to achieve a comparable writing speed by delivering the same laser power, the resultant intensity profile is that of plot 64, whose peak intensity per unit area is four times as high. Unfortunately, it is likely that the process could not tolerate such a high power per unit area. To comply with process limits on power per unit area, one would need to employ an intensity profile more like the one that of plot 66. If the beam shape employed to achieve this profile is symmetrical, then the result is a reduction by a factor of four in delivered power and thus in the available writing speed.

But we have recognized that the desired edge-position insensitivity requires plot 66's narrowness only in the direction of dither deflection. The profile can be four times as wide (i.e., 200 microns) in the direction parallel to the scan motion and thereby achieve the desired power without exceeding process limits on power per unit area.

Figure 23:
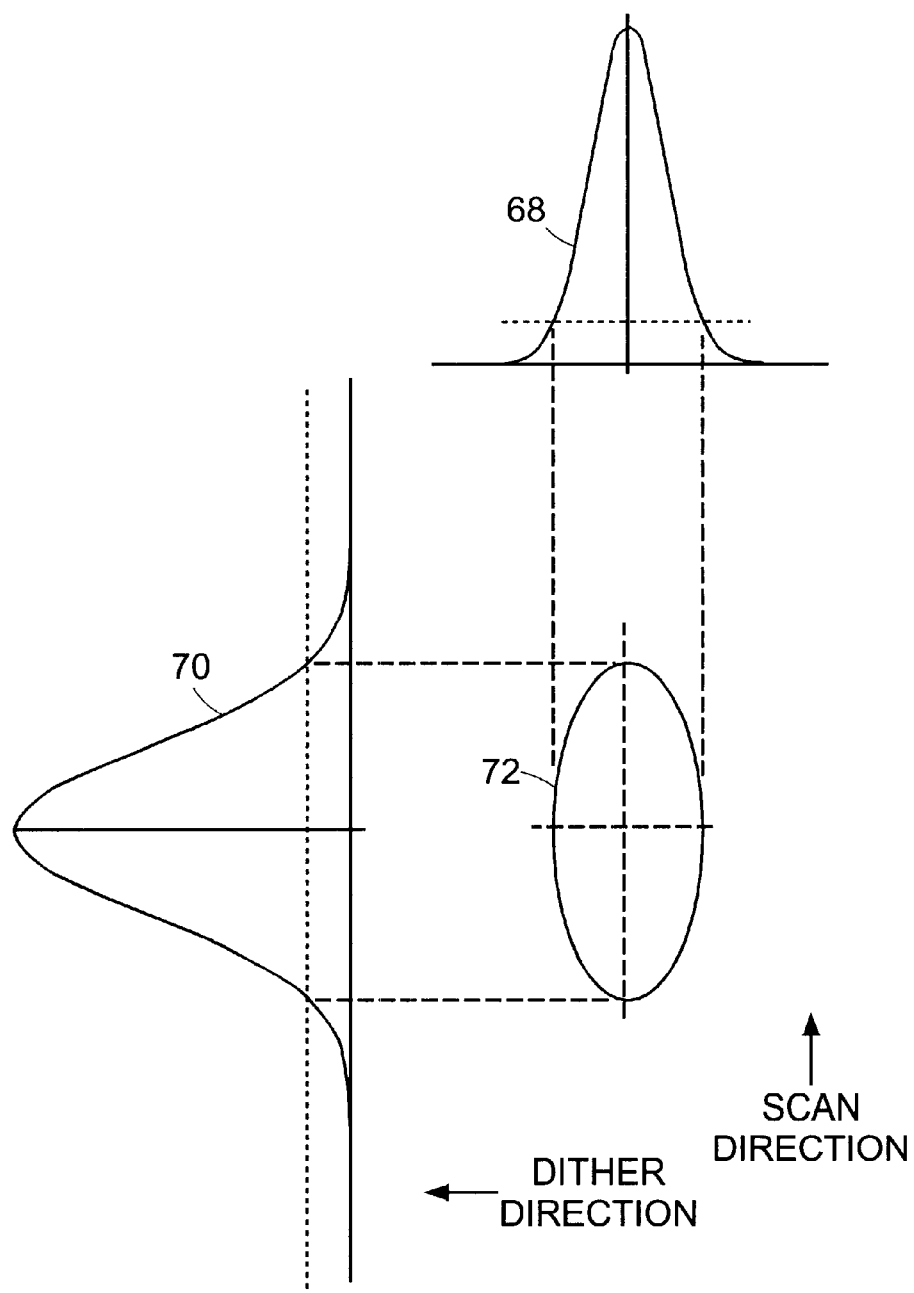
FIG. 23 is a graph of the different intensity profiles exhibited by an anamorphic light spot.

For example, the intensity profile in the dither direction can be the one that FIG. 23's plot 68 depicts, while its intensity profile in the scan direction can be that of plot 70. The resultant spot 72 is anamorphic: the spot width along the spot's major axis exceeds that along its minor axis. The particular ratio of major-axis width to minor-axis width will depend on the application, but it will usually exceed 2.

The particular way in which the oblong spot shape is achieved is not a critical feature of the invention. Some lasers naturally generate asymmetrical beams, for instance, and such a laser could be used to produce the oblong spot. If the simple two-element system of FIG. 5 were used with a symmetrical beam, it could be so designed that focal points for paraxial rays parallel to the yz plane lie on the stage's surface but that focal points for rays parallel to the xz plane lie below that surface. That would yield a spot narrower in the y direction than it is in the x direction.

Figure 24:
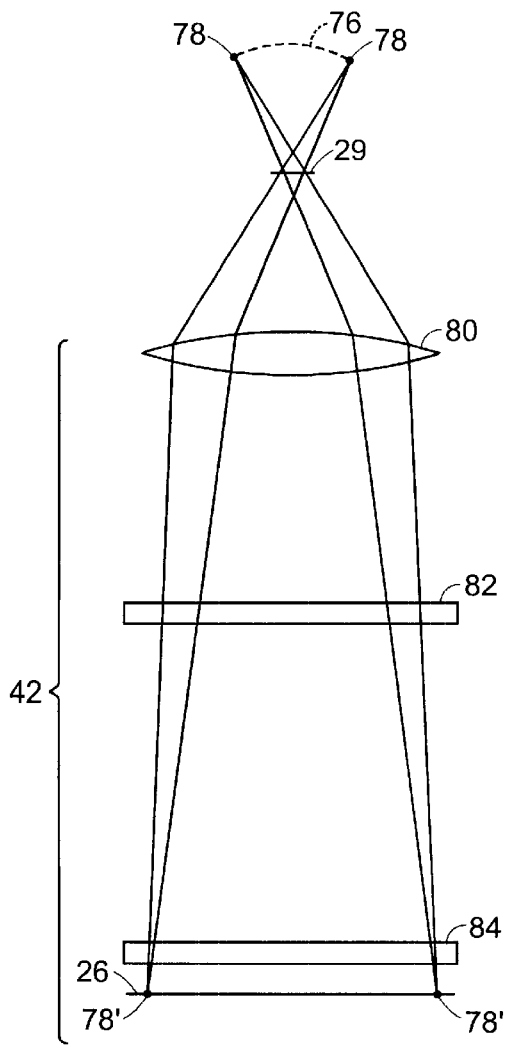
FIG. 24 is a simplified optical diagram of the main-scan-direction focusing characteristics of a scan-lens system that can be used to produce an anamorphic spot.
Figure 25:
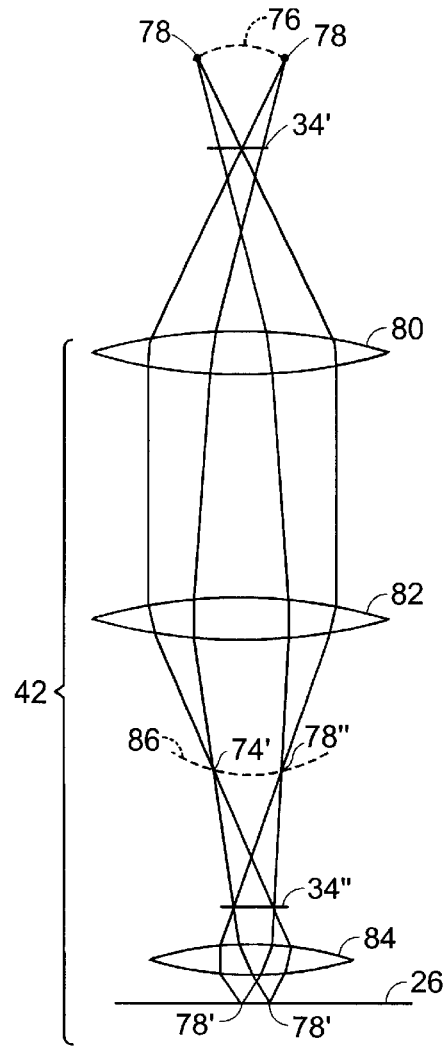
FIG. 25 is a simplified optical depicting the same scan-lens system's of the minor-scan-direction focusing characteristics.

In practice, we prefer to use a symmetrical beam and a lens system such as the one that FIGS. 24 and 25 depict. When that system is used, FIG. 5's relay lens is so positioned as to form a beam waist between itself and deflector 34. The narrowest position in that waist can be thought of as a point source of light. In FIGS. 24 and 25, respectively, xz-plane and yz-plane loci 74 and 76 depict the general contours of the locus of points in space through which deflectors 29 and 34 move the point source's image 78. In FIG. 24, tick mark 29 represents deflector 29's optical position, while FIG. 25's tick mark 34' represents that of deflector 34's image. As deflector 29 pivots, the point source's image travels along arc 76. As FIG. 24 shows, a first lens group 80 focuses light from the point source onto substrate locations whose positions depend on that of the point source's image.

To achieve the desired anamorphic processing, the lens system has different focusing characteristics in the x direction than in they direction. As FIG. 24 shows, second and third lens groups 82 and 84 have no power at all in the x direction, so they have essentially no effect on the x component of the resultant spot's position. Those groups instead affect the spot position's y component, as FIG. 25 illustrates. Specifically, lens group 82's y-axis power adds to that of lens group 80 to form an intermediate image 78" of the source 78.

The third group 84 forms the light spot on the substrate 26 by re-imaging the intermediate image with a numerical aperture higher than that with which the first group focuses the beam in the x direction. So the light-spot width in the y direction is considerably more narrow than that in the x direction.

Figure 1:
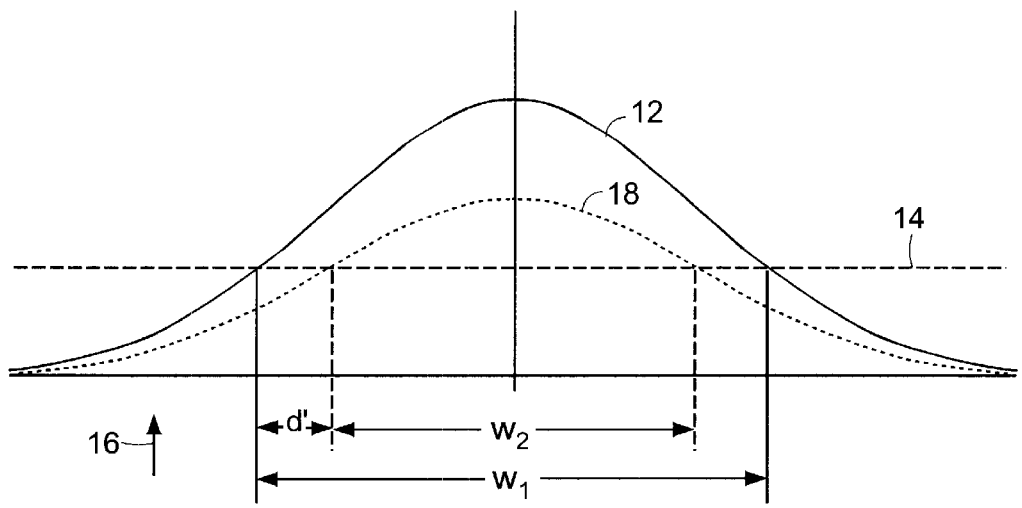
FIG. 1, described above, is a plot of a laser-produced light spot's intensity profile.
Figure 2:
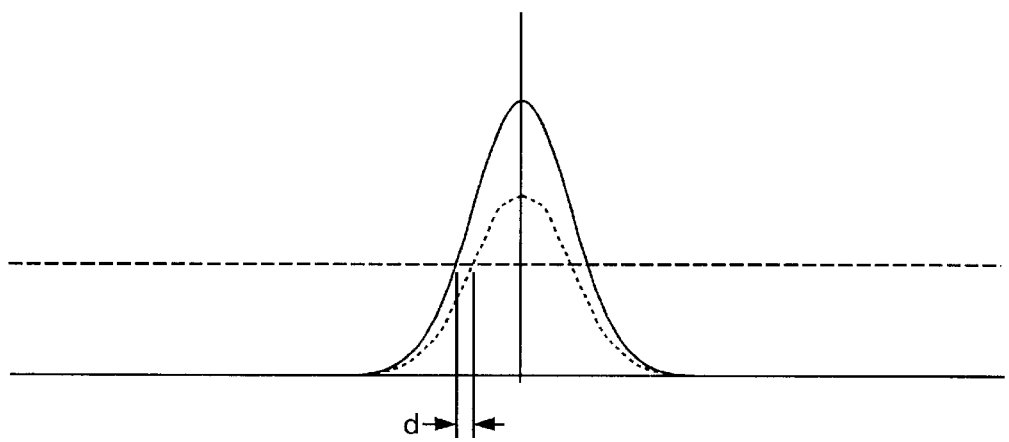
FIG. 2, described above, is a similar plot of a narrower light spot.
Figure 3:
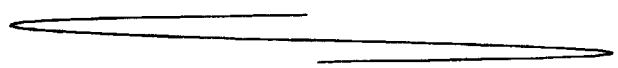
FIG. 3, described above, is a plot of a path that a dithered light spot may take during scanning.
Figure 26:
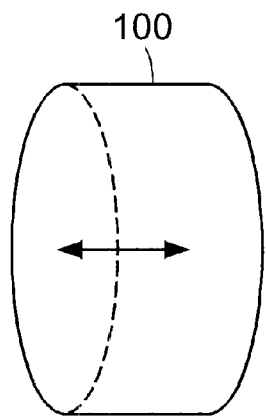
FIG. 26 is a diagram of the effective spot shape that results when the spot of FIG. 23 is dithered.
Figure 27:
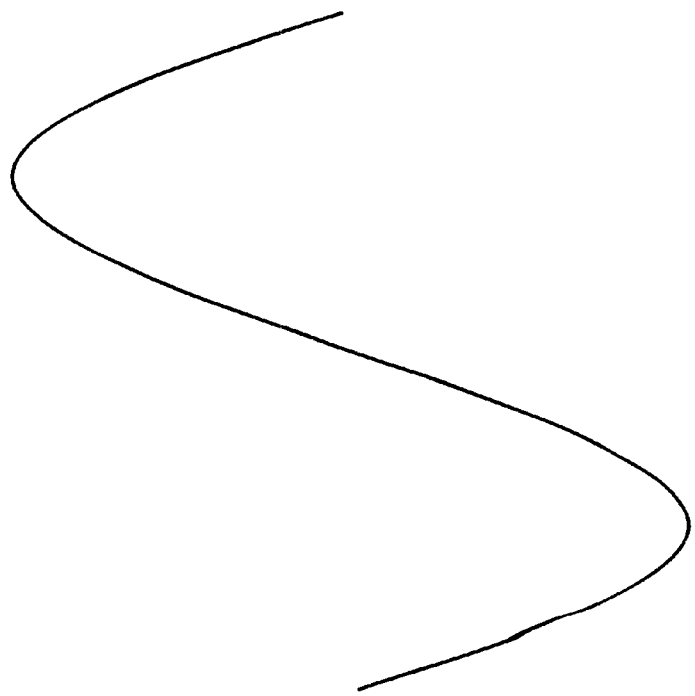
FIG. 27 is a plot of path that a dithered anamorphic light spot may take.

No matter how the oblong shape 72 is achieved, the spot is dithered to result in the effective spot shape 100 that FIG. 26 depicts. Typically, the dither direction is orthogonal to the scan direction and largely parallel to the anamorphic spot's minor axis. Reflection reveals that the resultant permissible scan speed for a given dither-oscillation frequency is considerably higher than could be achieved by using a symmetrical spot. For example, suppose that the actual spot's dither-direction (narrower-width) profile is that of FIG. 2 but that the spot is oblong enough to deliver the same total power as a symmetrical spot whose profile is that of FIG. 1. To achieve the effective spot profile of FIG. 4 in that case, the scan speed can be fast enough, for the same temporal dither frequency, to result in the track of FIG. 27 rather than that of FIG. 3.

By employing the foregoing teachings, the benefits of dithering can be obtained with much less scan-speed limitation. The present invention thus constitutes a significant advance in the art.

What is claimed is:

1. For producing a pattern on a workpiece surface, a method including:
   A) providing a source of a light beam;
   B) providing an optical system that so directs the light beam to a target plane as, if an object's surface is disposed in the target plane, to form a light spot thereon, the optical system including:
      i) a scan deflector that so deflects the beam by various scan angles as to cause scanning motion of the light spot; and
      ii) a dither deflector operable by application of a dither-control signal thereto to dither the position of the light spot with respect to the scanning motion thereof by deflect the a dither angle that varies with a beam dither amplitude determined by the dither-control signal's value and thereby causes an effective light-spot size that is greater than the actual light-spot size and, for a given beam dither amplitude, varies with scan angle;
   C) positioning a workpiece with a workpiece surface in the target plane; and
   D) employing the source and the optical system to produce a desired effective spot size on the workpiece surface by applying a varying dither-control signal to the dither deflector.

2. A method as defined in claim 1 wherein the dither-control signal so varies the beam dither amplitude with scan angle that any variation in effective light-spot size with scan angle is less than it would be if the beam dither amplitude were independent of scan angle.

3. A method as defined in claim 2 wherein the scan deflector includes a mirror.

4. A method as, defined in claim 3 wherein the scan deflector includes a galvanometer that drives the mirror.

5. A device as defined in claim 1 wherein the dither deflector causes the light spot to oscillate through at least two cycles for each scan-direction-width increment of scan-direction motion.

6. A method as defined in claim 1 wherein the dither deflector dithers the position of the light spot by causing it to oscillate in directions substantially orthogonal to the direction of the scanning motion.

7. A method as defined in claim 1 wherein the source includes a laser.

8. A method as defined in claim 1 wherein the optical system so directs the light beam to the target plane that the light spot is anamorphic, being widest in a major-axis direction and narrowest in a minor-axis direction.

9. A method as defined in claim 8 wherein the optical system so directs the light beam to the target plane that the light spot is at least twice as wide in the major-axis direction as it is in the minor-axis direction.

10. A method as defined in claim 8 wherein the dither deflector dithers the position of the light spot by causing it to oscillate in the minor-axis direction.

11. A method as defined in claim 1 wherein:
    A) the method further includes taking measurements of the effective light-spot size as a function of the scan angle and the value of dither-control signal;
    B) determining the value of the control signal in accordance with the measurements thus taken.

12. A method as defined in claim 11 wherein the measurements are taken by placing in the target plane a mask that forms an aperture narrower than the effective spot size, moving the light spot with respect to the mask, and sensing the radiation intensity of the light that passes through the aperture.

13. A method as defined in claim 11 wherein the dither deflector includes an acousto-optical device.

14. A method as defined in claim 13 wherein the measurements are taken by placing in the target plane a mask that forms an aperture narrower than the effective spot size, moving the light spot with respect to the mask, and sensing the radiation intensity of the light that passes through the aperture.

15. A method as defined in claim 13 wherein the scan deflector includes a mirror.

16. A method as defined in claim 15 wherein the scan deflector includes a galvanometer that drives the mirror.

17. A method as defined in claim 11 wherein the source includes a laser.

18. A method as defined in claim 17 wherein the measurements are taken by placing in the target plane a mask that forms an aperture narrower than the effective spot size, moving the light spot with respect to the mask, and sensing the radiation intensity of the light that passes through the aperture.

19. A method as defined in claim 11 wherein the optical system so directs the light beam to the target plane that the light spot is anamorphic, being widest in a major-axis direction and narrowest in a minor-axis direction.

20. A method as defined in claim 19 wherein the measurements are taken by placing in the target plane a mask that forms an aperture narrower than the effective spot size, moving the light spot with respect to the mask, and sensing the radiation intensity of the light that passes through the aperture.

21. A method as defined in claim 19 wherein the dither deflector dithers the position of the light spot by causing it to oscillate in the minor-axis direction.

22. An optical marking apparatus comprising:
A) a source of a light beam;
B) an optical system that so directs the light beam to a target plane as, if an object's surface is disposed in the target plane, to form a light spot thereon, the optical system including:
   i) a scan deflector that so deflects the beam by various scan angles as to cause scanning motion of the light spot; and
   ii) a dither deflector operable by application of a dither-control signal thereto to dither the position of the light spot with respect to the scanning motion thereof by deflecting the beam by a dither angle that varies with a beam dither amplitude determined by the dither-control signal's value and thereby causes an effective light-spot size that is greater than the actual light-spot size and, for a given beam dither amplitude, varies with scan angle; and
C) a controller that applies to the dither deflector a dither-control signal that varies the beam dither amplitude.

23. An optical marking apparatus as defined in claim 22 wherein the dither-control signal so varies the beam dither amplitude with scan angle that any variation in effective light-spot size with scan angle is less than it would be if the beam dither amplitude were independent of scan angle.

24. An optical marking apparatus as defined in claim 23 wherein the scan deflector includes a mirror.

25. An optical marking apparatus as defined in claim 24 wherein the scan deflector includes a galvanometer that drives the mirror.

26. An optical marking apparatus as defined in claim 22 wherein the dither deflector causes the light spot to oscillate through at least two cycles for each scan-direction-width increment of scan-direction motion.

27. An optical marking apparatus as defined in claim 22 wherein the dither deflector dithers the position of the light spot by causing it to oscillate in directions substantially orthogonal to the direction of the scanning motion.

28. An optical marking apparatus as defined in claim 22 wherein the source includes a laser.

29. An optical marking apparatus as defined in claim 22 wherein the optical system so directs the light beam to the target plane that the light spot is anamorphic, being widest in a major-axis direction and narrowest in a minor-axis direction.

30. An optical marking apparatus as defined in claim 29 wherein the optical system so directs the light beam to the target plane that the light spot is at least twice as wide in the major-axis direction as it is in the minor-axis direction.

31. An optical marking apparatus as defined in claim 29 wherein the dither deflector dithers the position of the light spot by causing it to oscillate in the minor-axis direction.

* * * * *